United States Patent
Yokley et al.

(10) Patent No.: US 8,962,097 B1
(45) Date of Patent: Feb. 24, 2015

(54) SURFACE PROPERTIES OF POLYMERIC MATERIALS WITH NANOSCALE FUNCTIONAL COATING

(71) Applicants: Edward Maxwell Yokley, Anderson, SC (US); Yaw Samuel Obeng, Frederick, MD (US)

(72) Inventors: Edward Maxwell Yokley, Anderson, SC (US); Yaw Samuel Obeng, Frederick, MD (US)

( * ) Notice: Subject to any disclaimer, the term of this patent is extended or adjusted under 35 U.S.C. 154(b) by 0 days.

(21) Appl. No.: 13/665,314

(22) Filed: Oct. 31, 2012

Related U.S. Application Data

(63) Continuation-in-part of application No. 12/206,013, filed on Sep. 8, 2008, now abandoned.

(60) Provisional application No. 60/970,582, filed on Sep. 7, 2007, provisional application No. 61/564,415, filed on Nov. 29, 2011.

(51) Int. Cl.
*B29C 59/14* (2006.01)
*B05D 3/06* (2006.01)
*B05D 3/14* (2006.01)

(52) U.S. Cl.
CPC ............... *B05D 3/144* (2013.01); *B29C 59/14* (2013.01)
USPC ...................................................... 427/535

(58) Field of Classification Search
CPC ........ C23C 22/05; C23C 22/34; C23C 22/82; C23C 22/78; C23C 14/001; C23C 14/0021; C23C 14/0031; C23C 14/0057; C23C 14/02; C23C 14/022; C23C 14/024; C23C 14/221; C23C 14/543; C23C 14/5826; A61L 31/14; A61L 2400/18; A61L 29/14; A61M 25/0017; A61M 25/0009; A61M 25/0045; B05D 3/144; B05D 1/62; D06M 10/04; B29C 59/142

See application file for complete search history.

(56) References Cited

U.S. PATENT DOCUMENTS

| | | | |
|---|---|---|---|
| 3,839,307 A | | 10/1974 | Schmifg |
| 3,941,728 A | | 3/1976 | Solenberger |
| 3,941,730 A | | 3/1976 | Solenberger |
| 4,269,896 A | * | 5/1981 | Yamagishi ............... 428/696 |
| 4,311,828 A | * | 1/1982 | Imada et al. ............. 528/483 |
| 4,569,850 A | * | 2/1986 | Harris et al. ............. 426/482 |
| 4,927,560 A | * | 5/1990 | Osaka et al. ............. 516/112 |

(Continued)

FOREIGN PATENT DOCUMENTS

WO      WO 2006132308 A1 * 12/2006

OTHER PUBLICATIONS

Bhuvanesh Gupta, Christopher Plummer, Isabelle Bisson, Peter Frey, Jons Hilborn, Plasma-induced graft polymerization of acrylic acid onto poly(ethylene terephthalate) films, characterization and human smooth muscle cell growth on grafted films, Biomaterials 23 (2002) 863-871.*

(Continued)

*Primary Examiner* — Gordon R Baldwin
*Assistant Examiner* — Mohammad Mayy

(57) ABSTRACT

A film deposition process comprising exposing a surface of a substrate to a first plasma treatment having plasma reactants in a plasma chamber to form an activated substrate surface. The activated surface has a lower water contact angle than the substrate surface before the surface activating. The process comprises introducing water vapor into the plasma chamber to form a water layer on the activated surface. The process comprises introducing pre-cursors molecules into the plasma chamber in the presence of a second plasma to graft a layer of reacted pre-cursor molecules on the water layer.

16 Claims, 6 Drawing Sheets

(56) References Cited

U.S. PATENT DOCUMENTS

| | | | |
|---|---|---|---|
| 4,927,676 A | 5/1990 | Williams et al. | |
| 5,013,338 A | 5/1991 | Anand et al. | |
| 5,019,210 A * | 5/1991 | Chou et al. | 427/307 |
| 5,041,304 A * | 8/1991 | Kusano et al. | 427/535 |
| 5,227,023 A * | 7/1993 | Pounder et al. | 162/101 |
| 5,314,724 A * | 5/1994 | Tsukune et al. | 427/489 |
| 5,344,462 A * | 9/1994 | Paskalov et al. | 8/115.52 |
| 5,576,072 A * | 11/1996 | Hostettler et al. | 427/532 |
| 5,622,626 A | 4/1997 | Matkovich et al. | |
| 5,840,190 A | 11/1998 | Scholander et al. | |
| 5,993,972 A | 11/1999 | Reich et al. | |
| 6,455,239 B2 | 9/2002 | Oishi et al. | 430/502 |
| 6,550,915 B1 * | 4/2003 | Grobe, III | 351/159.33 |
| 6,575,823 B1 | 6/2003 | Obeng et al. | |
| 6,579,604 B2 * | 6/2003 | Obeng et al. | 428/319.3 |
| 6,596,388 B1 | 7/2003 | Obeng et al. | |
| 6,684,704 B1 | 2/2004 | Obeng | |
| 6,688,956 B1 | 2/2004 | Yokley et al. | |
| 6,706,383 B1 | 3/2004 | Obeng et al. | |
| 6,716,733 B2 | 4/2004 | Lee et al. | |
| 6,764,574 B1 | 7/2004 | Obeng et al. | |
| 6,818,301 B2 * | 11/2004 | Obeng et al. | 428/411.1 |
| 6,821,570 B2 | 11/2004 | Obeng et al. | |
| 6,838,169 B2 | 1/2005 | Obeng | |
| 6,846,225 B2 | 1/2005 | Obeng et al. | |
| 7,059,946 B1 | 6/2006 | Obeng et al. | |
| 7,303,575 B2 | 12/2007 | Ogle | |
| 7,579,077 B2 | 8/2009 | Dubrow et al. | |
| 7,901,744 B2 | 3/2011 | Denes et al. | |
| 7,923,053 B2 * | 4/2011 | Kitching et al. | 427/2.1 |
| 8,216,663 B2 | 7/2012 | Takayanagi | |
| 8,313,985 B2 | 11/2012 | Hatcher, Jr. et al. | |
| 8,323,754 B2 | 12/2012 | Olsen et al. | |
| 8,492,908 B2 | 7/2013 | Siomkos et al. | |
| 2001/0006706 A1 * | 7/2001 | Picard | 427/428 |
| 2001/0050056 A1 * | 12/2001 | France et al. | 118/716 |
| 2002/0081441 A1 * | 6/2002 | Desu et al. | 428/451 |
| 2003/0021980 A1 | 1/2003 | Obeng et al. | |
| 2003/0031876 A1 | 2/2003 | Obeng et al. | |
| 2003/0077436 A1 | 4/2003 | Obeng et al. | |
| 2003/0194504 A1 * | 10/2003 | Bilyk et al. | 427/458 |
| 2004/0110449 A1 | 6/2004 | Obeng | |
| 2004/0132308 A1 | 7/2004 | Obeng | |
| 2005/0055885 A1 | 3/2005 | Obeng | |
| 2005/0095865 A1 | 5/2005 | Obeng et al. | |
| 2005/0153631 A1 | 7/2005 | Obeng | |
| 2005/0253069 A1 * | 11/2005 | Zewail et al. | 250/311 |
| 2005/0260357 A1 | 11/2005 | Olsen et al. | |
| 2005/0266226 A1 | 12/2005 | Obeng | |
| 2006/0093771 A1 | 5/2006 | Rypacek et al. | |
| 2006/0154579 A1 | 7/2006 | Marks et al. | |
| 2006/0251795 A1 * | 11/2006 | Kobrin et al. | 427/2.1 |
| 2007/0015444 A1 | 1/2007 | Marks et al. | |
| 2007/0122540 A1 * | 5/2007 | Salamone et al. | 427/2.24 |
| 2007/0236863 A1 * | 10/2007 | Lee et al. | 361/313 |
| 2008/0044588 A1 * | 2/2008 | Sakhrani | 427/490 |
| 2009/0035523 A1 | 2/2009 | Takayanagi et al. | |
| 2009/0069790 A1 | 3/2009 | Yokley et al. | |
| 2009/0258255 A1 * | 10/2009 | Terashima et al. | 429/12 |
| 2010/0035074 A1 * | 2/2010 | Cohen et al. | 428/500 |
| 2010/0086604 A1 | 4/2010 | Stellacci et al. | |
| 2011/0123475 A1 | 5/2011 | Dias et al. | |
| 2012/0097970 A1 | 4/2012 | Siomkos et al. | |

OTHER PUBLICATIONS

B. Gupta, J. Hilborn, CH. Hollenstein, C. J. G. Plummer, R. Houriet, N. Xanthopoulos, Surface Modification of Polyester Films by RF Plasma, Journal of Applied Polymer Science, vol. 78, 1083-1091 (2000).*

Yokley, Edward M., et al., "Separation of Bulk and Surface Properties of Polymeric Materials by the Creation of Nanoscale Functional Coatings," Fall 2004 National Meeting of the American Chemical Society, Aug. 23, 2004.

Othman, N., et al., "Electrical Properties of Polypyrrole Conducting Polymer at Various Dopant Concentration", Journal of Fundamental Sciences 5 (2009) pp. 29-33.

Kodama, Hideyuki, et al., "Synthesis of Practical High-Gas-Barrier Carbon Films at Low and Atmospheric Pressure for PET Bottles", new Diamond and Frontier carbon Technology, vol. 16, No. 2, 2006, pp. 107-119.

* cited by examiner

SURFACE PROPERTIES OF POLYMERIC MATERIALS WITH NANOSCALE FUNCTIONAL COATING

CROSS-REFERENCE TO RELATED APPLICATION

This is a continuation in part application of U.S. application Ser. No. 12/206,013 filed on Sep. 8, 2008, entitled Surface Properties of Polymeric Materials with Nanoscale Functional Coating to Yokley and Obeng, which in turn claims the benefit of U.S. Provisional Application Ser. No. 60/970,582 filed on Sep. 7, 2007, entitled Improving Surface Properties of Polymeric Materials by the Creation of Nanoscale Functional Coatings, to Yokley and Obeng and also claims the benefit of U.S. Provisional Application Ser. No. 61/564,415 filed on Nov. 29, 2011 entitled, Surface Properties of Polymeric Materials with Conformal Dry Nanoscale Functional Coatings to Yokley and Obeng, all being commonly assigned with the present invention and incorporated herein by reference.

TECHNICAL FIELD

This application is directed, in general, to a process for depositing films, the films formed by the process and, more specifically, to a process for forming conformal surface film coatings for protecting electronic and other devices.

BACKGROUND

There is a growing requirement for conformal barrier coatings or films having high adhesion for corrosion protection, water proofing, surface decoration, for medical device passivation, circuit board moisture protection, consumer electronic devices and a wide variety of industrial, consumer devices and similar objects. There is a need to better engineer the air-substrate interface of such films for specific applications. For example, it is often desirable for films to modify the substrate surface without altering the bulk properties of the substrate. It is sometimes desirable to engineer films to have the potential to enhance the structural and functional performance of fabricated polymeric devices. Enhancement of the surface can occur with designed organic, inorganic or hybrid polymeric coatings. However, many existing films suffer from poor adhesive bonding to the underlying surface, since the device materials construction are inherently non-reactive to reduce the incidence of reactions with the surrounding tissues.

SUMMARY

One embodiment of the disclosure provides a film deposition process, comprising exposing a surface of a substrate to a first plasma treatment having plasma reactants in a plasma chamber to form an activated substrate surface. The activated surface has a lower water contact angle than the substrate surface before the surface activating. The process comprises introducing water vapor into the plasma chamber to form a water layer on the activated surface and introducing pre-cursors molecules into the plasma chamber in the presence of a second plasma to graft a layer of reacted pre-cursor molecules on the water layer.

BRIEF DESCRIPTION OF THE DRAWINGS

Reference is now made to the following descriptions taken in conjunction with the accompanying drawings, in which.

DETAILED DESCRIPTION

As part of the present disclosure, it was discovered that forming a water layer after a plasma cleaning and activating step enhances the formation of films, such conformal films for the purpose of providing a moisture and environmental barrier to protect electronic or other devices. This discovery was made by accident when, between a first plasma treatment to atomically clean and activate a substrate's surface, and a second plasma treatment to expose the activated surface to pre-cursors molecules, the activated surface was inadvertently exposed to air having a high moisture content.

For the purposes of the present disclosure, the term atomically cleaned and activated, or, plasma cleaned and activated, refers to the treatment of a substrate surface with low molecular weight molecules or atoms (e.g., Helium, Argon, Nitrogen, Neon, Silane, Hydrogen and Oxygen) in the presence of a radiofrequency plasma, to clean the substrate's surface by making the surface free of contaminants such as organic contaminants and water. Such a plasma treatment, referred to a first plasma treatment herein, also actives the substrate's surface by breaking up covalent and/or other chemical bonds of the substrate molecules at the surface, thereby making the substrate surface easier to react with plasma treated pre-cursors molecule.

It is counter-intuitive to think that it would be beneficial to first expose such a cleaned and activated surface to water vapor before exposing the surface to plasma treated pre-cursors molecules. It is counter-intuitive because one of the goals of such a plasma treatment is to remove contaminates from a surface, which typically includes removing water from the surface. While not limiting the scope of the invention by theoretical considerations, it is thought that exposure of the cleaned and activated substrate surface to water vapor results in the adsorption or chemisorption of a water layer, e.g., one or more monolayers of water, onto the surface. It is thought that a water layer at the interface between the substrate and grafted layered of various plasma treated pre-cursors molecules promotes the formation of strong bonds between the grafted material and the substrate. A quantitative indicator of the presences of such an activated surface is that the surfaces has a lower water contact angle (e.g., at least about 10 percent and in some cases at least about 20 percent lower) than the substrate surface before the surface activation.

The term water layer as used herein refers to one or more self-assembled monolayers of water molecules. For instance, the water layer can range from a monolayer (e.g., a thickness of about 0.3 nanometers) to several monolayers (e.g., a thickness of about 2 nanometers). One skilled in the art would appreciate how the extent of adsorption and thickness of the resultant water layer would be controlled by the thermodynamic conditions present in the plasma chamber containing the substrate and water vapor.

Figure 1:
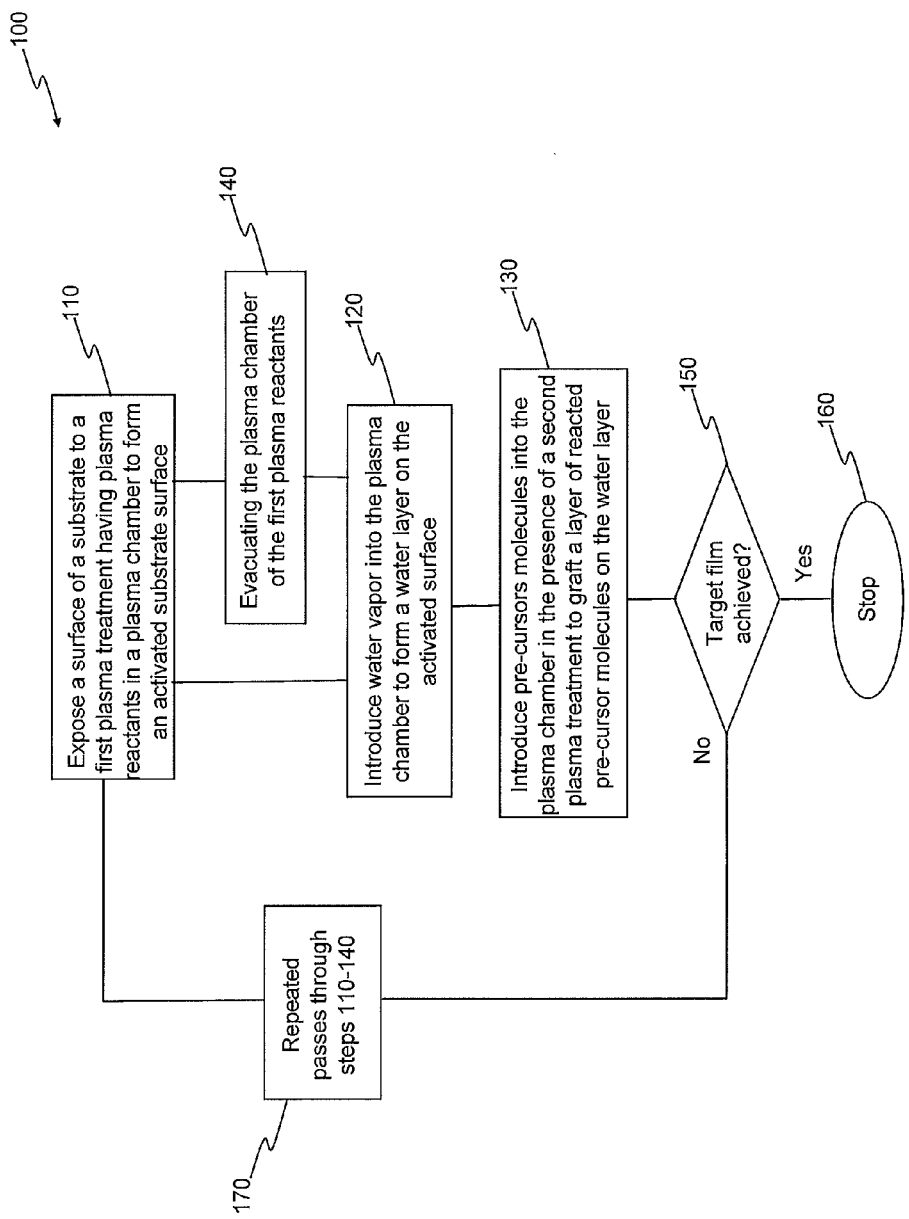
FIG. 1 shows a flow diagram showing steps in an example process of the present invention.
Figure 2:
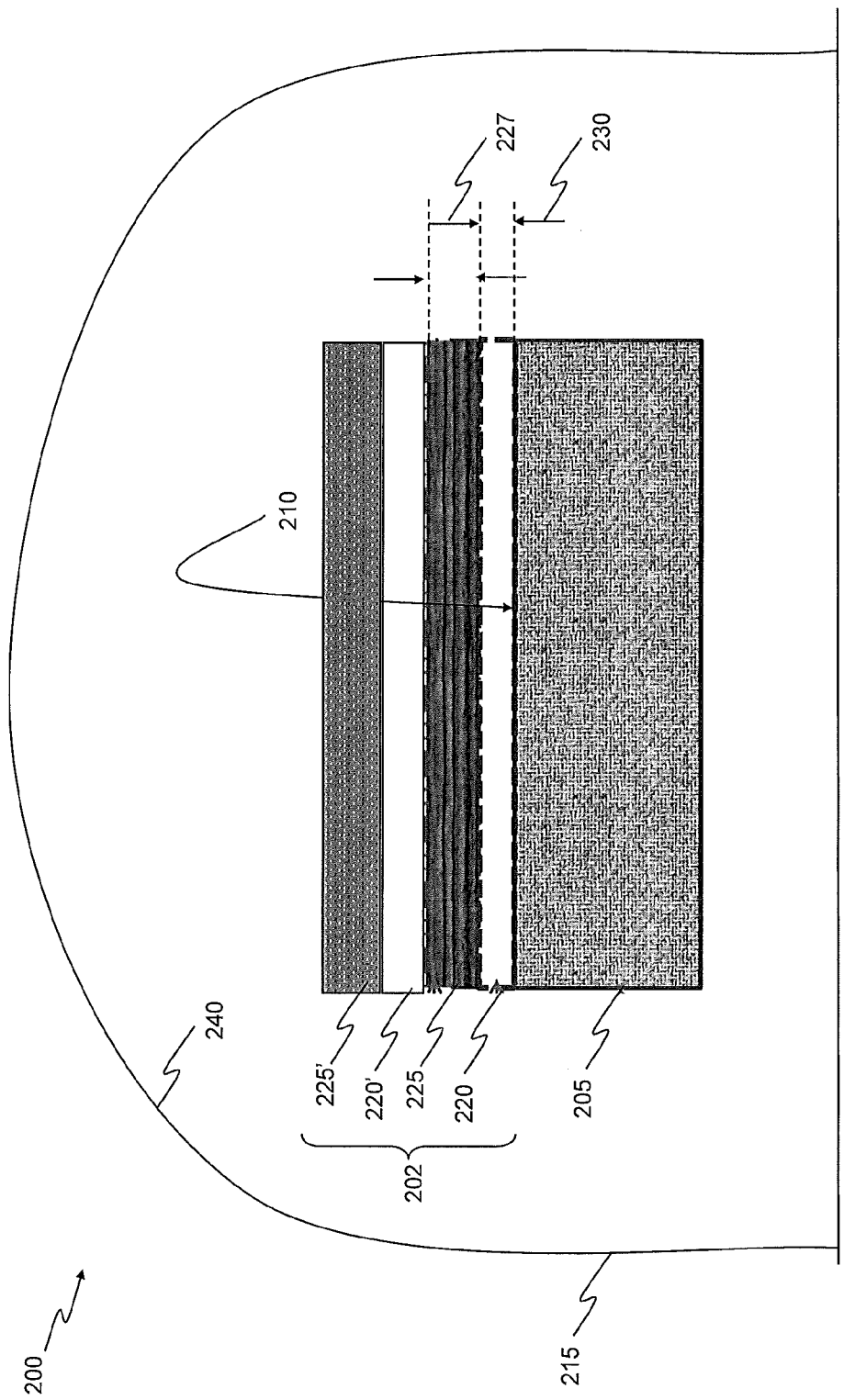
FIG. 2 shows a cross-sectional view of an example film formed on a substrate is accordance with a process of the disclosure such as any of the embodiment discussed in the context of FIG. 1.

FIG. 1 shows a flow diagram showing selected steps in an example film deposition process 100 of the disclosure. FIG. 2 shows a cross-sectional view of an example device 200 (e.g., a circuit board) have film 202 formed on a substrate 205, in accordance with a process of the disclosure such as any of the embodiment discussed in the context of FIG. 1.

With continuing reference to FIGS. 1 and 2 throughout, the example process 100 comprises a first step 110 of exposing a surface 210 of a substrate 205 to a first plasma treatment having plasma reactants in a plasma chamber 215 to form an activated substrate surface 210. For instance, in any of the embodiments of the process 100, the substrate 205 can be a circuit board and the surface 210 is a component-side surface of the circuit board. In some embodiments the film layer 202 can be a conformal coating designed to protect an electronic device, such as a circuit board, from moisture under autoclave sterilization conditions.

As discussed above, step 110 can serve to atomically clean and activate the substrate's surface 210. The process 100 also comprises a step 120 of introducing water vapor into the plasma chamber to form a water layer 220 on the activated surface 210. The process 100 also comprises a step 130 of introducing pre-cursors molecules into the plasma chamber 215 in the presence of a second plasma treatment to graft a layer 225 of reacted pre-cursor molecules on the water layer 220.

In some embodiments of the process 100, the first plasma reactants in step 110 are formed from one or more of Helium, Argon, Nitrogen, Neon, Silane, Hydrogen and Oxygen. In some cases reactants are in the presence of the first plasma treatment that includes: a radiofrequency power in the range of about 30 to 500 Watts, a temperature in range of about 0° C. to about 100° C. for a time period in a range of about 0.5 to 10 minutes. In some such embodiments, the first plasma reactants are formed from Argon at pressures between about 50 and 500 mTorr in the presence of the first plasma treatment that includes a radiofrequency power in the range of about 50 to 200 Watts, a temperature in range of about 0° C. to about 100° C. for a time period in a range of about 0.5 to about 10 minutes.

In some embodiments of the process 100, following exposure to water vapor as humid air (in step 120), in step 130, the substrate surface 210 having the water layer 220 thereon is exposed a flux of plasma-cracked, reactive organic or ceramic precursor intermediates. Illustratively, such intermediates can be formed from monomers introduced into a modified plasma environment, under conditions that preserve the integrity of the reactive intermediate species formed. Specifically, the plasma generation conditions should not result in the total fragmentation or decomposition of the precursor molecules, nor should the intermediates have very short residence time in the reactor. Also, the intermediates should be able to adsorb and react on the water layer on the cleaned and activated substrate surface 210.

In some embodiments the water layer 220 formed in step 120, is desirably not greater in thickness 230 than about 2 nanometers. When the water layer thickness 230 is greater than 2 nanometers, the outermost water molecules of the layer 220 are not tenaciously bound, either chemically or physically, to the substrate surface 210. These outermost water molecules can desorb and react with the incoming precursor species in step 130 to form new species which may be undesirable or not beneficial to the film deposition process 100. Furthermore, the desorbed excess water molecules can adsorb on the plasma chamber walls 240, and later on leach off of the wall 240 to thereby contaminate and impede the film deposition process 100. Experiments performed as part of the present disclosure, suggest a water layer thickness 230 of 0.1 to 2 nanometers produces a balanced situation where the benefits of the water layer 220 are realized while avoiding the undesirable effects of excess water.

While not limiting the scope of the invention by theoretical considerations, it is thought that, in some cases, under the reduced pressure of the process conditions used in step 130, all or some of the adsorbed water layer 220 can be lost through desorption. During step 130, it is also thought that water molecules of the layer 220 can deprotonate to afford reactive oxygen-radical rich surfaces with chemically unsatisfied dangling bonds exposed to the flux of cracked monomer intermediates. The reactive surface is thought to rapidly react with the reactive species in the process chamber 215 to form strong chemical bonds (e.g., covalent bonds), which result in the grafted layer 225 being bonded to the substrate surface 210.

In some cases, the deposited film 202 having the grafted layer 225 of reacted pre-cursor molecules, after step 130, retains at least part of the water layer 220 in-between the surface 210 of the substrate 205 and the grafted layer 225. For example, in some cases, the retained water layer 220 has a thickness 230 in a range from about 0.1 to 2 nanometers. For example, in some cases, the retained water layer has a thickness 230 in a range from about 0.3 to 1.8 nanometers (e.g., a stack of about 1 to 6 self-assembled monolayers of water). In such embodiments, it is thought that the molecules of the water layer 220 form a bonding link between the grafted layer 225 of reacted pre-cursor molecules and the substrate surface 210.

In some embodiments of the process 100, organic (e.g., simple olefins to fluoro-olefins) or pre-ceramic monomers pre-cursor molecules are applied in step 130 to form graphed layers 225 having a thickness 235 in a range of about 50 to 500 nanometers. In some embodiments the grafted layer 130 (and in some cases retained water layer 220) provide complete coverage, conformal to an irregular substrate surface 210 and are tightly bounded with high durability.

In some embodiments of the process 100, the precursor molecules in step 130 include hexafluoropropylene and Argon at pressures between about 100 and 500 mTorr and the second plasma treatment includes: a radiofrequency power in the range of about 50 to 250 Watts, a temperature in range of about 10° C. to about 80° C. for a time period in a range of about 15 to about 60 minutes.

As further illustrated in FIG. 2, the process 100 can further include a step 140 of evacuating the plasma chamber 215 of the first plasma reactants (e.g., in step 110) after forming the activated substrate surface 210 and before introducing the water vapor into the plasma chamber 215 (e.g., in step 120). For instance, some embodiments of step 140 evacuating the plasma chamber 215 includes reducing the atmospheric pressure in the chamber 215 to less than about 100 Torr for at least about 5 minutes. Step 140 can advantageously mitigate the formation of undesirable or not beneficial species from the reaction between the water vapor introduced in step 120 and plasma reactants formed in the chamber 215 in step 110.

In some embodiments of the process 100, it is desirable to introduce the water vapor into the chamber 215 in step 120 to form the water layer 220. For instance, in some cases, the water vapor is in the chamber 215 when the second plasma treatment (e.g., step 130) is commenced. That is, as part of step 120 the water vapor is introduced into the plasma chamber to expose the activated surface to the water vapor before introducing the pre-cursors molecules into the plasma chamber 215 (e.g., step 130). It is also desirable to introduce the water vapor for a sufficient period to form the desired thickness 230 of water layer 220 but as discussed above, not to form an overly thick layer 220. For instance, in some cases, the water vapor is in the chamber 215 for at least about 5 minutes before the second plasma treatment in (e.g., step 130) is commenced. For instance, in some cases, the water vapor is in the chamber 215 for at least about 5 minutes and not longer than 10 minutes before the second plasma treatment is (e.g., step 130) is commenced. It is also desirable to introduce the water vapor in a sufficient concentration to form the desired thickness 230 of water layer 220 and not to form an overly-thick layer 220. For instance, in some cases, as part of step 120, introducing the water vapor into the plasma chamber 215 includes introducing air into the chamber, wherein the air has a humidity of least about 45 percent at about 20° C. for at least about 5 minutes, and in some cases, not longer than about 10 minutes, before introducing the pre-cursors molecules into the plasma chamber 215 (e.g., step 130).

In some embodiments of the process 100, a single-pass through steps 110, 120, 130 (and sometimes optional step 140) is sufficient to product the desired film layer 202 and therefore in decision step 150, it is decided the target film has been achieved and the process 100 is ceased at stop step 160. However in other cases, if it is decided in step 150 that the film layer should comprise multiple grafted layers 225, the process 100 can include repeating in step 170, at least one time, each of the sequence of steps of exposing the surface (step 110), introducing the water vapor (step 120) and introducing the pre-cursors molecules (step 130) and sometimes optional step 140. There can be repeated passes, e.g., a three or more passes, through steps 110, 120, 130 and sometimes optional step 140. For instance, as further illustrated in FIG. 2, there can be multiple pairs of retained water and grafted layers 220, 220', 225, 225' that comprise the film 202 formed by such repeated passes in accordance with step 170.

For instance, there is no upper limit to the number post surface activation steps and hence the number of layers of different materials that can be deposited on the substrate surface 210. As illustrated in the examples to follow, the process 100 is compatible with a wide range of substrate material composition and shapes, as well as monomer chemistry types that can be deposited in step 130. The surface characteristics of the final film 202 can be adjusted according to the second plasma treatment conditions and pre-cursor molecules in each pass through steps 110-140.

Presented below are examples of how the above-described steps in the process 100 could be monitored and implemented for particular embodiments of films 202 (sometimes referred to as a coating herein) on various types of substrate surfaces. Additional examples of first and second plasma treatments as part of steps 110 and 130, as also presented in U.S. application Ser. No. 12/206,013 and U.S. Provisional Application Ser. No. 60/970,582 which are incorporated by reference if reproduced in their entirety herein. Still other examples of first and second plasma treatments as part of steps 110 and 130 are presented in U.S. Pat. Nos. 6,579,604 and 6,846,225 which are incorporated by reference herein in their entirety.

Figure 3:
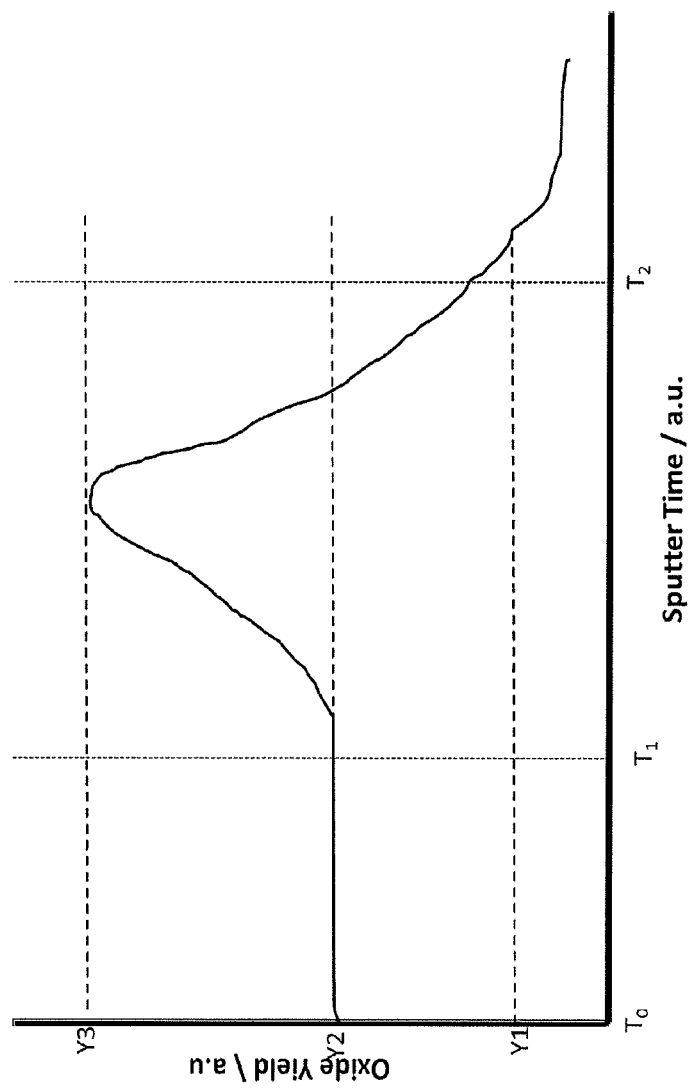
FIG. 3 shows a simulated time-of-flight secondary ion mass spectrometry (TOF-SIMS) trace of an example film formed on a substrate is accordance with a process of the disclosure such as an embodiment (e.g., a one-pass embodiment) of the film deposition process presented in FIG. 1.

A film layer 202 modification of a substrate surface 210, such as formed in accordance with the process 100 in FIG. 1 and as depicted in FIG. 2, can be characterized by time-of-flight secondary ion mass spectrometry (TOF-SIMS). FIG. 3 shows a generalized simulated expected TOF-SIMS trace of such a surface. In this example application, "Oxide Yield" is defined as the detected relative concentration of oxygen containing species emanating from the sputtered surface reaching the detector of the TOF-SIMS tool. In the trace depicted in FIG. 3, the time from $T_o$ to $T_1$ represents the time it takes to sputter through the outermost graphed layer 225 in FIG. 2. The time $T_1$ to $T_2$ represents the time it takes to sputter through the residual water-derived interfacial water layer 220.

In this disclosure, atomically clean surfaces can be characterized by time-of-flight secondary ion mass spectrometry (TOF-SIMS) traces devoid of any elemental yields other than that of the substrate. The suitable materials for deposition by some embodiments of the disclosure offer a very wide range of physical, chemical and optical properties and some are well known polymers from bulk polymerization processes. For example, self-cleaning barrier films or coatings that provide catalytic self-cleaning and barrier properties (e.g., layers of $TiO_2$ $ZnO_2$ and $SnO2$) can be formed. $TiO_x$ structures on a variety of substrates have been demonstrated using embodiments of the process. In this disclosure metal oxides of uncertain stoichiometry are denoted as $MO_x$ where M=Si, Al, Ti, Ta, Zr, Zn, Sn, or Zr, and, $—O_x$ represents oxide or sub-oxides (e.g., x=1 to 4 in some cases).

Figure 4:
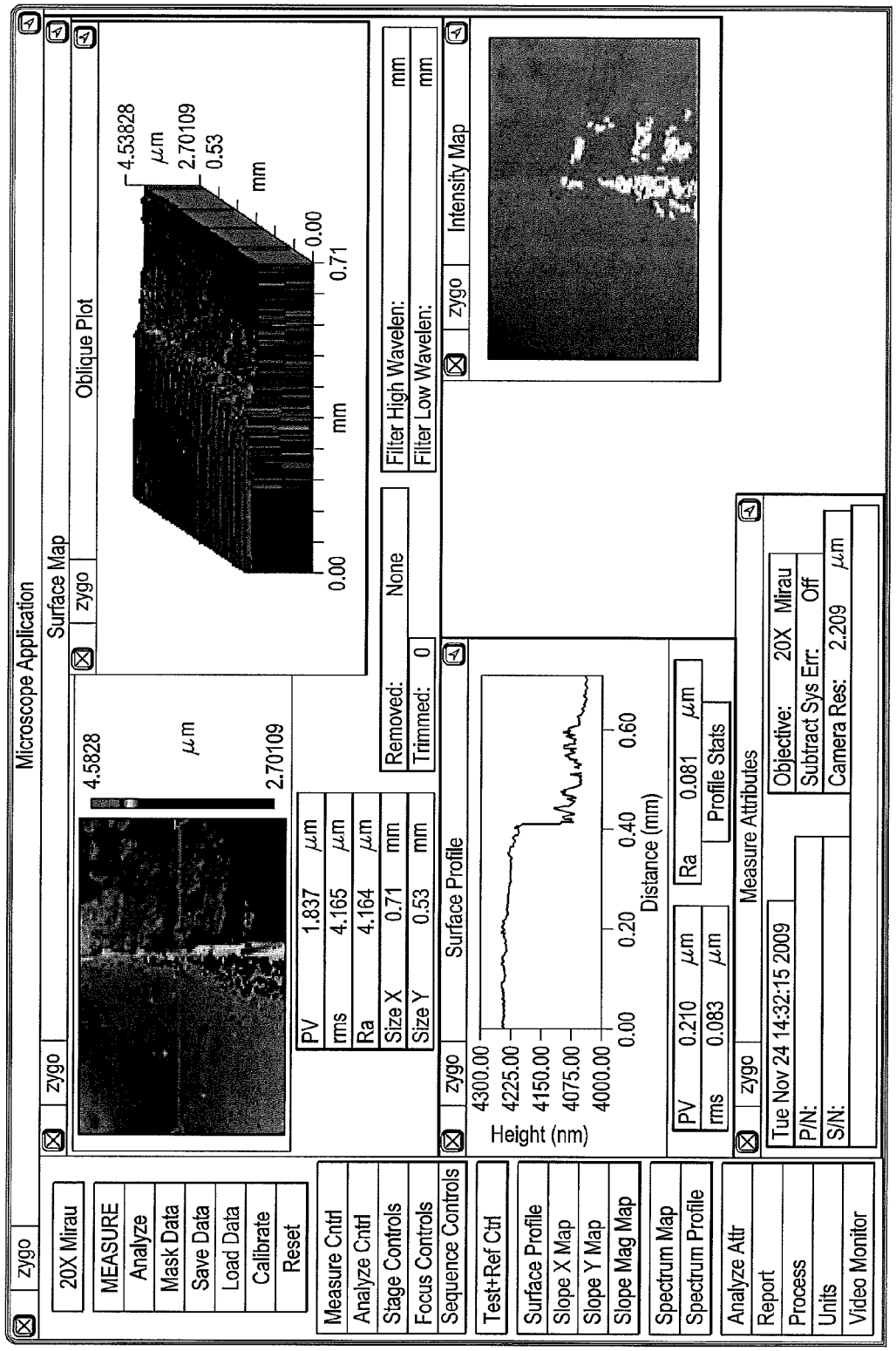
FIG. 4 shows an optical interferometry of an example masked step edge plasma-assisted silicon oxide (SiOx) deposited film on a glass substrate, produced in an example embodiment of the process flow in FIG. 1, where tetraethoxysilane (TEOS) was used as the precursor in the step following the exposure of the cleaned and activated surface to water vapor.

Using the multi-stage platform for nanoscale plasma enhanced single and multi-layered organic and ceramic nanoscale films 202 can be established on any substrate 205 of arbitrary composition and geometry. This flexibility permits the capability to tailor the surface modification chemistry to many applications. As an illustrative example, FIG. 4 shows an optical interferometry of a masked step edge silicon oxide ($SiO_x$) plasma assisted film on a glass substrate produced by a two-stage process where tetraethoxysilane (TEOS) was used as the precursor molecule in the final stage (step 130). The applied film 202 is dense, smooth and of about 200 nm in thickness.

The specific properties of the deposited film 202 are sensitive to the precise process conditions used in the deposition. It is well known in the art that in the case of deposition on thermoplastic substrates, it is important to conduct the deposition at low temperatures to avoid dimensional distortion of the substrate. Likewise, the process of the current invention is designed to circumvent the typical 1-2 day surface reversion to low energy observed for many thermoplastic substrates treated with plasma. This invention takes advantage of the surprising beneficial effect of humid air on the atomically cleaned substrate surface to provide compact conformal films with excellent conformal barrier films with excellent adhesion properties. The customized versions of the multi-stage platform for nanoscale plasma enhanced coatings can afford a rapid low cost method for applying application specific coating combinations to industrial parts to improve impact strength, abrasion resistance and corrosion resistance. Examples of the demonstrated coatings include, but not limited to titanium oxide coatings for glass objects, silicon oxide coatings for corrosion resistant rotor blades and aircraft parts.

A film 202 can be formed of polymeric materials by a process 100 that includes exposing a polymeric substrate to at least two plasma treatments (e.g., in steps 110 and 130). A first plasma treatment creates a modified reactive surface on the substrate. The subsequent second plasma treatment produces a grafted layer 225 thereon. The initial plasma treatment is done while controlling the temperature of a radiofrequency electrodes to about 10 to 100° C.

The specific conditions used during the first plasma treatment can strongly influence characteristics of the polymeric substrate's surface. For instance, different initial plasma treatments followed by the same subsequent plasma treatment can result in grafted layer surfaces that are either hydrophilic or hydrophobic. The first plasma treatment can include a plasma reactant such as Helium, Argon, Nitrogen, Neon, Silane, Hydrogen and Oxygen and mixtures thereof. In some cases, the initial plasma treatment reaction is conducted at a radiofrequency power of 30 to 500 Watts.

The second subsequent plasma treatment can have subsequent plasma reactants that include vinyl or acrylic monomers. Example monomers include monomers 1-Vinyl-2-pyrrolidinone, 2-Hydroxyethylmethacrylate, Allyl Alcohol, Allyl Amine, Substituted Allyl Amines of 4-10 Carbon Atoms, Acrylic Acid, Acrylic Esters of 2-10 Carbon Atoms, Acrylamides of 3-10 Carbon Atoms. In some cases the resulting surface can be used as a tie layer under a conventional solvent, spray, dip or powder coating. The conventional coating can then be used to bind a drug or other therapeutic material. In other cases, the subsequent plasma treatment can have subsequent plasma reactants that include metal alkoxide esters of Silicon, Titanium, Tantalum, Aluminum, Zirconium, or Zinc.

The process 100 can adapt the multi-pass plasma grafting technique described above into a multiple step process specifically designed for modifying and functionalizing the surfaces of medical devices. An advantage of the method described in this application is the ability to apply coatings on a dry-in dry-out basis, and/or in a sterile anaerobic environments. Using this method, parts can be placed into a treatment chamber dry and emerge after treatment both dry and sterile. The thin film coatings produced by the disclosed techniques are chemically bonded to the surface and are thus highly resistant to adhesion failures, delamination, flaking or debonding. The films are also coherent and uniform and are resistant to decohesion and tearing. Areas of the coated devices that need to remain non lubricious can be easily masked during the plasma coating process. The lubricity of the coating is activated by treatment of the surface with water or body fluids.

The so-deposited film stack 202 could be comprised of organic and or inorganic polymers. The organic polymers are made from monomers can be selected of a group comprising, but not limited to, common lubricious monomers such as N-vinylpyrrolidinone and hydroxyethylmethacrylate and their copolymers ethylene and propylene oxide and their derivatives. The polymers are created in-situ at the substrate surface from treatment of the substrate in the plasma/monomer environment.

These plasma created polymer coatings provide lubricity when contacted with water or saline solution. The coated device is dry to the touch prior to water treatment for facile handling by medical or surgical personnel. The mechanical properties of the coatings, such as the flexibility of the deposited coating, can be modified by incorporation during the plasma polymerization of volatile crosslinking agents such as diallylethers, polyallylamines, gylcoldiacrylates or glycoldimethacrylates into the monomer stream. Monomers with reactive functional groups containing amine, hydroxyl, and carboxylic acid functional groups can provide sites for the further coupling of surface binding or other materials and polymers, including designer drugs for targeted delivery. For example, known lubricious urethane polymers can be attached to preceding layers containing these reactive surfaces. Further, direct attachment or binding of gel mixtures of antibiotic or other drugs can be accomplished using standard solution coating or gas phase under non-plasma vacuum/reduced pressure techniques. The coatings of this invention, including common lubricious monomers such as N-vinylpyrrolidinone, which provides lubricity when contacted with water or saline solution, have been applied on a dry-in/dry-out basis. The coated device is dry to the touch prior to water treatment for facile handling by medical or surgical personnel. Further, coating of monomers with reactive handles containing amine, hydroxyl, and carboxylic acid functional groups can provide sites for the surface binding of antibiotic or other drugs have been demonstrated.

Table 1 is a compendium of the conditions in a coating processes on miscellaneous substrates using the process 100 which includes two steps: a first plasma treatment in accordance with step 110 (step P1) and a second plasma treatment in accordance with step 130 (step P2), and the characterization data of the resultant articles. The substrates used in these experiments were made from polymers commonly associated with biomedical devices. In all cases, the modified surfaces showed permanent improvements in their hydrophilic (reduced water contact angles relative to the untreated substrates)

Table 1: A compendium of the processing conditions, and the characterization data of the resultant articles. The first plasma treatment (P1 stage) and second plasma treatment (P2 stage) are interspersed with humid air exposure in accordance with step 120.

| Sample ID | Substrates | P1 RF Power | P1 Time | P1 Gas | P1 Pressure | P2 Monomer | P2 RF Power | P2 Time | P2 Gas | P2 Pressure |
|---|---|---|---|---|---|---|---|---|---|---|
| 1-10A | Tygon Tubing | NA | NA | NA | NA | NA | NA | NA | NA | NA |
| 1-10B | Tygon Tubing | 50 | 4 | 20% O2, 80% Ar | 350 | TYZOR TPT | 50 | 20 | Ar | 350 |
| 1-3B | Tygon Tubing | 100 | 15 | Ar | 250 | TEOS | 50 | 20 | Ar | 250 |
| 1-5A | Tygon Tubing | 100 | 15 | Ar | 250 | 2-Hydroxyethyl Methracrylate | 50 | 20 | Ar | 250 250 |
| 1-2B | Tygon Tubing | 100 | 15 | | 250 | N-Vinylpyrrolidinone | 50 50 | 20 20 | Ar Ar | 250 250 |
| 1-11A | Red Rubber Bard Urethral Catheter | 50 | 3 | 20% O2 80% Ar | 250 | Hexamethyldisilazane | 50 | 20 | Ar | 350 |

-continued

| Sample ID | Substrates | P1 RF Power | P1 Time | P1 Gas | P1 Pressure | P2 Monomer | P2 RF Power | P2 Time | P2 Gas | P2 Pressure |
|---|---|---|---|---|---|---|---|---|---|---|
| 1-5E | Lexan Panel | 50 | 5.5 | 20% O2, 80% Ar | 350 | 2-Hydroxyethyl Methracrylate | 50 | 20 | Ar | 350 |
| 1-10C | Polycarbonate Panels | 50 | 4 | 20% O2, 80% Ar | 350 | TYZOR TPT | 50 | 20 | Ar | 350 |
| 1-5A | Silicone Medical Tubing | 100 | 15 | Ar | 250 | 2-Hydroxyethyl Methracrylate | 50 | 20 | Ar | 250 |
| 1-3C | Silicone Medical Tubing | 100 | 15 | Ar | 250 | TEOS | 50 | 20 | Ar | 250 |
| 1-3C | Silicone Medical Tubing | 100 | 15 | Ar | 250 | TEOS | 50 | 20 | Ar | 250 |
| 1-3D | Epoxy/Graphite Cylinder | 100 | 15 | Ar | 250 | TEOS | 50 | 20 | Ar | 250 |
| 1-3B | Latex Gloves | 100 | 15 | Ar | 250 | TEOS | 50 | 20 | Ar | 250 |
| 1-10D | Latex Gloves | 50 | 4 | 20% O2, 80% Ar | 350 | TYZOR TPT | 50 | 20 | Ar | 350 |
| 1-5A | Latex Gloves | 100 | 15 | Ar | 250 | 2-Hydroxyethyl Methracrylate | 50 | 20 | Ar | 250 |

The data in Table 1 shows that the process conditions used in the atomic cleaning and activation step P1 (step 110 of FIG. 1) strongly influence the eventual surface characteristics. For example, starting with same substrate and finishing with identical monomer and plasma step P2 conditions, sample 1-3F is hydrophilic while sample 1-5D is hydrophobic. The principal difference is in the plasma step P1 process condition; the process gas composition, plasma power and time were different.

Table 2: A compendium of the 2-Step processing conditions of Miscellaneous Substrates, and the characterization data of the resultant articles. The P1 and P2 stages are interspersed with humid air exposure in accordance with step 120.

the precursor molecule of step 130 can include polymerize 2-methyl-1,3-butadiene (isoprene) onto a variety of substrates using a single pass through of the process 100 (steps 110-130, and in some cases step 140). This is a special case of the general olefin polymerization process, since a coating is produced which can be further cross-linked by plasma post treatment or by other means In some embodiments, device substrates 205 benefit from a dry low friction, biologically inert grafted layer 225 surface with low adhesion to the biological tissues. These surfaces can be described as "dry lubricious". Such surfaces are useful in particular for invasive medical devices such as catheters, arthroscopic tubes and implements. Implements of this type

| Substrates | P1 RF Power | P1 Time | P1 Gas | P1 Pressure | P2 Monomer | P2 RF Power | P2 Time | P2 Gas | P2 Pressure | Contact Angle |
|---|---|---|---|---|---|---|---|---|---|---|
| Tygon Tubing | NA | NA | NA | NA | NA | NA | NA | NA | NA | 102 |
| Tygon Tubing | 50 | 4 | 20% O2, 80% Ar | 350 | TYZOR TPT | 50 | 20 | Ar | 350 | 82 |
| Tygon Tubing | 100 | 15 | Ar | 250 | TEOS | 50 | 20 | Ar | 250 | |
| Tygon Tubing | 100 | 15 | Ar | 250 | 2-Hydroxyethyl Methracrylate | 50 | 20 | Ar | 250 | |
| Tygon Tubing | 100 | 15 | | 250 | N-Vinylpyrrolidinone | 50 | 20 | Ar | 250 | 69 |
| Red Rubber Bard Urethral Catheter | 50 | 3 | 20% O2, 80% Ar | 350 | Hexamethyldisilazane | 50 | 20 | Ar | 350 | 70 |
| Lexan Panel | 50 | 5.5 | 20% O2, 80% Ar | 350 | 2-Hydroxyethyl Methracrylate | 50 | 20 | Ar | 350 | |
| Polycarbonate Panels | 50 | 4 | 20% O2, 80% Ar | 350 | TYZOR TPT | 50 | 20 | Ar | 350 | |
| Silicone Medical Tubing | 100 | 15 | Ar | 250 | 2-Hydroxyethyl Methracrylate | 50 | 20 | Ar | 250 | |
| Silicone Medical Tubing | 100 | 15 | Ar | 250 | TEOS | 50 | 20 | Ar | 250 | |
| Silicone Medical Tubing | 100 | 15 | Ar | 250 | TEOS | 50 | 20 | Ar | 250 | |
| Epoxyl Graphite Cylinder | 100 | 15 | Ar | 250 | TEOS | 50 | 20 | Ar | 250 | |
| Latex Gloves | 100 | 15 | Ar | 250 | TEOS | 50 | 20 | Ar | 250 | |
| Latex Gloves | 50 | 4 | 20% O2, 80% Ar | 350 | TYZOR TPT | 50 | 20 | Ar | 350 | |

In some embodiments, substrates 205 comprising feeding tube connectors and balloon catheters are surface modified by of the process 100 resulting in a graphed layer 225 of an elastomeric conformal coating. In such an embodiments of are advantageous during surgical insertion since no additional surface treatment water or external fluids are required during insertion. Some such embodiments of the disclosure use commercially available fluoro-monomers in producing low energy, hydrophobic, low coefficient of friction coatings via our two stage plasma coating process.

In some cases, the process 100 comprises a first grafted layer 225 of a conformal organic coating and subsequent grafted layers 225' (one or more repeated passes in accordance with step 170) of a plasma-assisted deposited, ceramic metal oxide coating. The forming of a plurality of subsequent grafted layers 225' (and in some cases water subsequent layers 220') where there exists one or more subsequent grafted layer 225 and (in some cases subsequent water layer 220) can in some cases include in step 110 exposing the upper-most preceding grafted layer 225 to a short burst of inert gas plasma designed to clean at the atomic level and to activate the surface of the preceding grafted layer 225, and then exposure to humid air in step 120, followed by plasma assisted deposition of a thin film comprised of ceramic metal oxide of ceramic-polymer hybrid conformal surface in step 130. In some cases, the ceramic metal oxide is in step 130 chosen from the group of Si, Al, Ti, Ta, Zr, Zn, Sn, Zr. The ceramic metal sub-oxide is chosen from the group of Si, Al, Ti, Zr, Zn, Sn, Zr.

In other cases, the subsequent graphed layer 225' can be another conformal organic coating such as an olefinic deposited conformal surface. In some cases, one or both the preceding graphed layer 225 and subsequent graphed layer 225' includes an olefinic precursor molecules chosen from the group of tyrene, 1-Hexene, or isoprene. In some cases, one or both the preceding graphed layer 225 and subsequent graphed layer 225' includes an olefinic precursor molecules that are paracyclophanes, such as parylene. In some cases, the organic coating is an olefinic hydrocarbon of 4-15 carbon atoms. In some cases, the organic coating is styrene. In some cases, one or both the preceding graphed layer 225 and subsequent graphed layer 225' includes an olefinic precursor molecules that are olefinic hydrocarbon of 4-15 carbon atoms.

In some embodiments, the precursor molecule used in step 130 is a monomer selected for subsequent direct chemical reaction binding of the grafted layer 225 to the substrate surface 110 are taken from the group of: acrylic acid, primary and acrylamides of up to 10 carbon atoms, allyl alcohol, primary and secondary allylamines up to 15 carbon atoms, allylglycidylether, hydroxyethylacrylate and methacrylate, hydroxypropylacrylate and methacrylate. In some embodiments the precursor molecules used in step 130 is 4-diallylaminopyridine. In some cases the subsequent grafted layer 225' can be fromed from precursor molecules of acrylic and methacrylic acids, tertiary allylamines in some cases 4-diallylaminopyridine.

In some embodiments, the film layer 202 produced is active in destroying chemical warfare agents. In some cases, the film produced is active in destroying toxic industrial fluids. In some cases, the film produced by the current invention is active in destroying organic molecules under electromagnetic wave irradiation. In some cases, the film 202 produced is active in destroying metal-organic complex molecules under electromagnetic wave irradiation.

In some embodiments the precursor molecule used in step 130 provides a conformal inert hydrogenated amorphous carbon film coating 202, in some cases containing sp3 and sp2 hybridized carbon, as well as C—H bonds, e.g., formed from precursor molecules that include volatile carbon-rich fluids such as one or more of carbon tetrachloride, chloroform, benzene, and xylene In some cases, the subsequent or second grafted layer 225 is a conformal inert hydrogenated amorphous carbon film coatings, formed in a repeated pass in accordance with step 170.

In some embodiments, the precursor molecule used in step 130 provides a conformal electrically and or thermally conducting film 202, e.g., formed from precursor molecules that include pyrrole, thiophene and aniline.

Some further illustrative examples of films 202 formed in accordance with the process 100 as presented below:

Example 1

Polypropylene tubes, polyethylene test tubes, aluminum sheet, and masked glass microscope slides, were placed in a plasma deposition chamber held between 0° C. and 100° C. and activated with Argon plasma at pressures between 50 and 500 mTorr at power between 50 and 200 Watts. Following activation, humid air or water saturated air was allowed to bleed into the deposition chamber until the chamber pressure reached 1 atmosphere, and then the system was evacuated to base pressure. The plasma assisted deposition stage was then initiated. Hexafluoropropylene was introduced into the plasma chamber under Argon plasma at pressures from 100 to 500 mTorr and power between 50 and 250 Watts and treatment was continued for between 15 to 60 minutes.

The process produced a yellow conformal coating. The thickness of the coating increased monotonically with increasing stage-two treatment time, reaching a thickness of about 100 nm in 60 minutes on all of the test surfaces. This suggests that the film deposition rate depended on the reactive precursor species reaching the activated surface, where it is readily incorporated into the growing film.

The films produced on all the test surfaces were smooth and hydrophobic, with static water contact angles of between 120°-125° C. and no contact hysteresis. The films were also highly adherent to the substrates, based on the results from a modified qualitative "Scotch tape peel" tests. In these tests, a piece of Scotch™ brand tape was firmly pressed onto the coated substrate for 5 minutes and then quickly removed at 90-degrees. If little or none of the yellowish coating was peeled substrate surface, then the adhesion of the film to the substrate is considered good. All the tested samples, produced in this example passed this test.

Example 2

Experiments were conducted to evaluate the efficacy of various barrier coatings in protecting electronic circuitry. In this example, the ability to reduce the shifts caused by autoclaving in the air flow characteristic of arthroscopic flowmeters was evaluated. The device was built as normal, calibrated for air flow and verified in normal ambient tests. The devices were then disassembled, and the control electronics coated by the methods of this invention, as described below. The devices were then reassembled with coated electronics boards then retested for air flow at pre-determined set points.

In one embodiment, an electronic board previously coated with Parylene-C was subjected to a two stage plasma activation and deposition process. The first stage was carried out in argon plasma at 250 mTorr at 100 W power for up to 5 minutes. Following activation, humid air or water saturated air was allowed to bleed into the deposition chamber, which was partially pre-filled with an inert gas, until the chamber pressure reached 1 atmosphere, and then the system was evacuated to base pressure, backfilled with the inert gas and pumped down to base pressure twice before the plasma assisted deposition stage was then initiated. In the plasma assisted deposition stage, subsequent, tetraethyloxyorthosilane [TEOS] was introduced and plasma conditions of 250 mTorr and 100 W maintained for 25 minutes to yield a conformal SiO$_x$ overcoating.

In another embodiment, a circuit board controller was first subjected to a two stage plasma activation and deposition process. The first stage was carried out in argon plasma at 250 mTorr at 100 W power for up to 5 minutes. In the plasma assisted deposition stage, Tetraethyloxyorthosilane [TEOS] was introduced and plasma conditions of 250 mTorr and 100 W maintained for 25 minutes to yield a conformal SiO$_x$ coating. This was followed by thermal vapor coating with Parylene-C, and then finally coated again with the two stage plasma process, interspersed with humid-air breaks of Example 1 to create a three layer conformal barrier coating.

The electronic control boards were evaluated using a modified unbiased autoclave test (JEDEC Standard JESD22-A102, http:www.jedec.org, incorporated by reference herein in its entirety). The JEDEC Standard JESD22-A102 test is a highly accelerated test which employs conditions of pressure, humidity and temperature under condensing conditions to accelerate moisture penetration through the external coating materials and along the interface between the external protective film material and the underlying metallic components. The autoclave test used to simulate device survivability in harsh conditions amd/or long-term reliability testing. The circuit boards were subjected to multiple heat and cool cycles.

Large air flow deviations at low flow set points are characteristics of the flow meters tested in this example, and such deviations were used as index of flow meter performance. In these tests. The failure criterion is a flow deviation at 20%; any device showing flow deviation of greater than 20% at any gas flow set point is considered to have failed.

Figure 5:
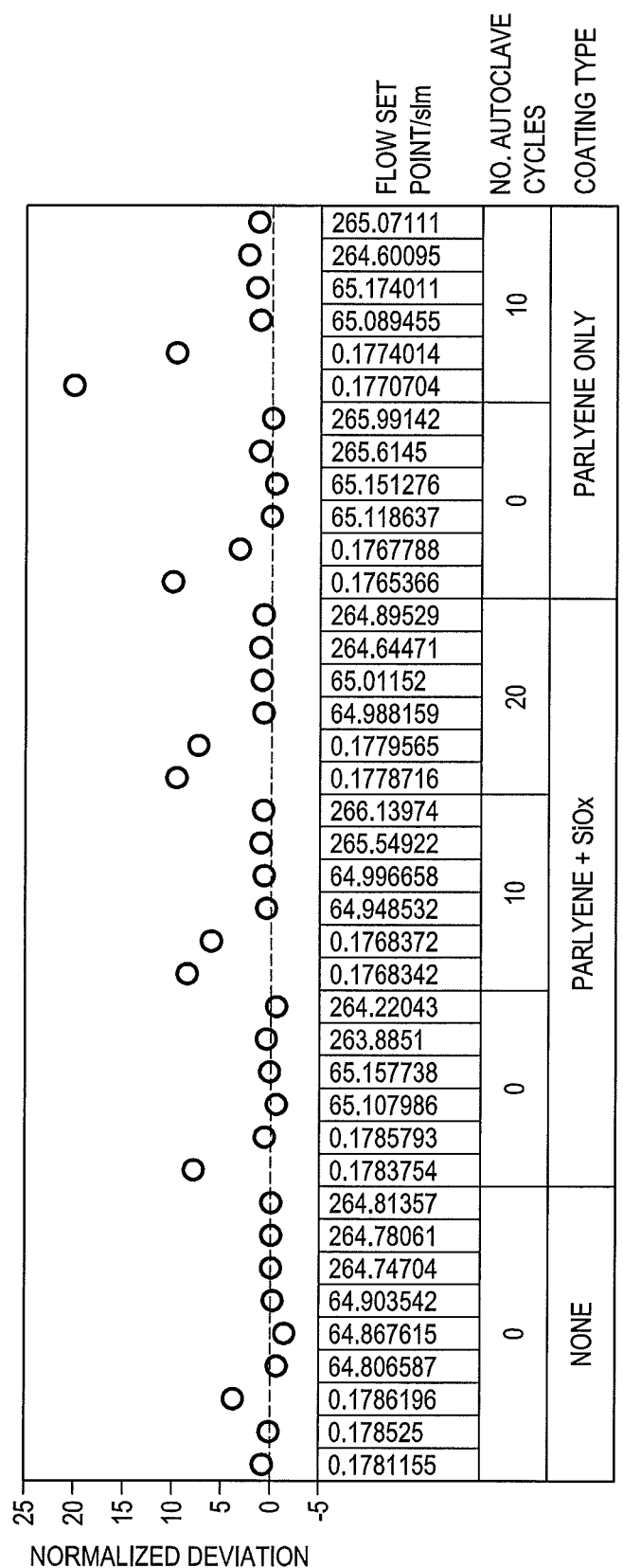
FIG. 5 presents a summary of example air flow rate deviations measured after an example autoclave cycling tests such as described in Example 2 of the application.

FIG. 5 and Table 4 summarize the results from these tests. The results clearly show that the under- and over-coat of parlyene with SiO$_x$ from the current invention significantly improved the performance and the long-term reliability of the control electronics evaluated.

TABLE 3

Summary of the results from Autoclave Cycling tests in Example 2

| Coating Type | Max Number of Cycles Before Fail |
|---|---|
| None | 0 |
| 40 nm Parylene Only | 10 |
| 40 nm Parylene + 100 nm SiO2 Overcoat | >20 |
| 100 nm SiO2 undercoat/40 nm Parylene/100 nm SiO2 overcoat | >20 |

Example 3

Polyethylene blow-molded fuel tanks for small engines were sealed to mitigate permeation of hydrocarbon fluids. The untreated tanks have inherent permeability of hydrocarbon fluids and the current state of the art mitigation treatments, such as gaseous fluorination of the tank surfaces in large chambers and multilayer polymer co-extrusion are environmentally less preferred and capital intensive respectively.

A commercial polyethylene blow molded small engine fuel tank (e.g., obtained from Mergon Corporation, Anderson, S.C.) was coated with SiO$_x$ using the process of this invention. The blow molded fuel tanks were coated in the two stage plasma process consisting of a plasma activation stage from 2-10 minutes at 50-100 W Argon plasma at 100-500 MTorr, preferably at 250 mTorr, followed by a plasma grafting stage, where Tetraethyloxyorthosilane [TEOS] was introduced. The plasma conditions of the grafing stage were 100-250 MTorr and 100 W maintained for 25 minutes. The resultant thickness of the conformal SiO$_x$ over-coating was about 150 nm.

To evaluate the effectiveness of the coatings in suppressing fuel loss, the coated tanks were filled with commercial 87 octane gasoline, closed with a commercial small engine fuel tank cap, placed in a covered, 10 gallon polyethylene buckets, and stored at room temperature for 26 months. Identical, but uncoated control tanks were likewise filled and similarly stored. After 26 months, the mean net weight of the fuel remaining in the coated tanks was 397 g, as compared to 372 g remaining in the uncoated tanks. This demonstrates that the conformal coatings from this invention deposited on the fuel tanks were effective in mitigating hydrocarbon fuel loss due to permeation polyethylene blow molded fuel tank.

Example 4

Figure 6:
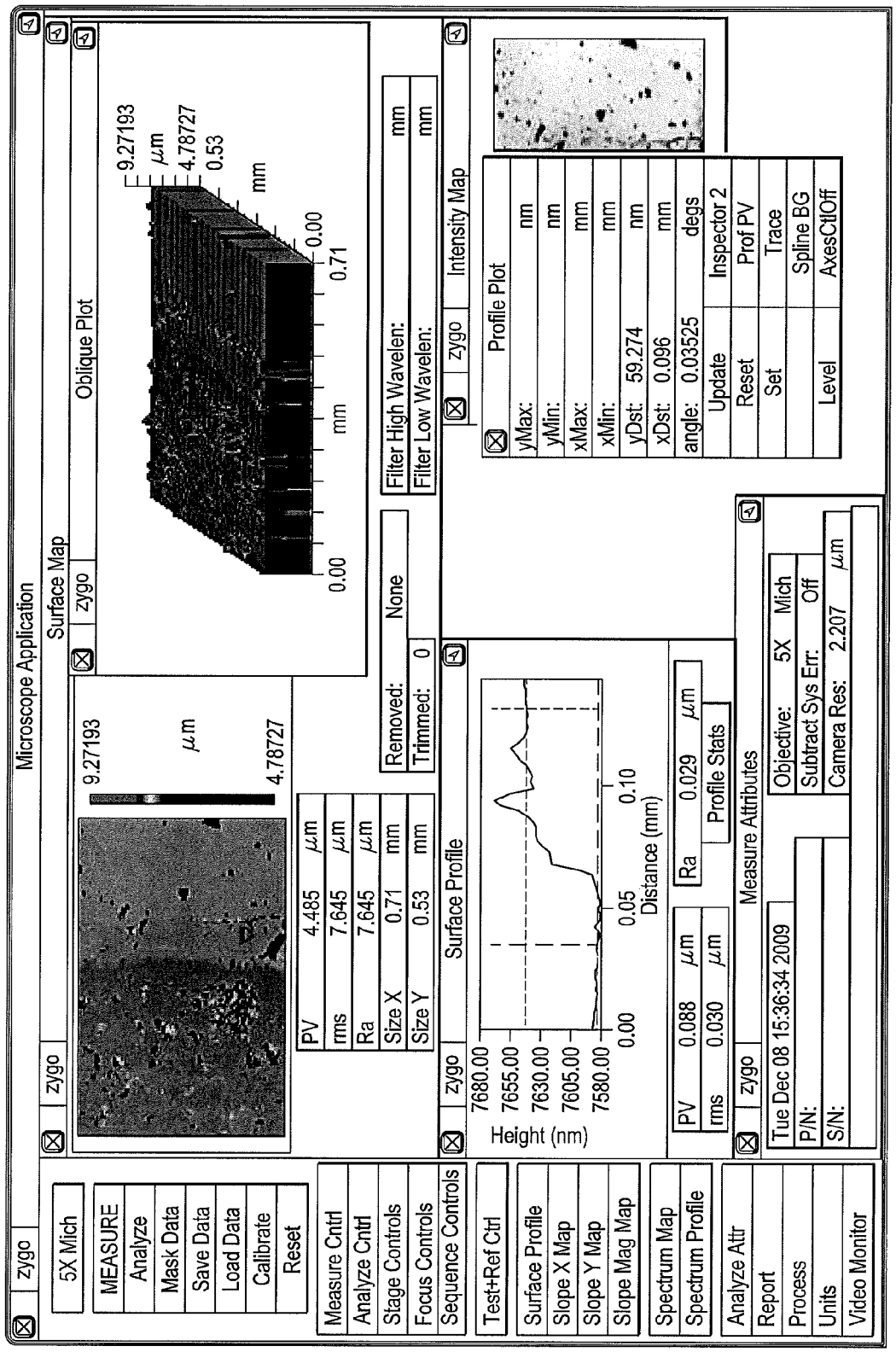
FIG. 6 presents an example optical interferometry image of an example 60 nm styrene film edge on a de-masked glass sample substrate in accordance to with a process of the disclosure such as an embodiment of the process presented in FIG. 1.

In a series of demonstration experiments, multi stage plasma based coatings were produced with a variety of olefinic monomers (Styrene, 1-Hexene, Isoprene) in the subsequent grafting stage to produce nanoscale conformal barrier coatings. The substrates were coated in the two stage plasma process consisting of a plasma activation stage from 1-10 minutes at 50-100 W argon plasma at 100-500 mTorr, preferably at 250 mTorr, followed by a plasma grafting stage, where olefinic monomers were introduced. The plasma conditions of the grafting stage were 100-250 mTorr, and preferably 100 W maintained for up to 30 minutes. Coatings were applied to polypropylene and polyethylene tubes, polycarbonate and acrylic sheets, aluminum sheets, and borosilicate glass slide substrates. The coatings were uniform, smooth and adherent between 60 and 200 nm in thickness deepening on specific process conditions. FIG. 6 shows an optical interferometry example image of an example 60 nm styrene coating edge on a de-masked borosilicate glass sample.

Other functional olefinic monomers can likewise be employed by the methods of this invention to produce reactive grafted surface polymers.

Example 5

The reactive surfaces demonstrated in example 4 can be employed as tie and/or priming coats and sub-coats to bind other materials to the surface or to catalyze chemical reactions at the surface. In example 1, the grafting of allyl alcohol and allylamine to a variety of substrates were demonstrated. In this example, other suitable monomers such as allylglycidylether, were used to graft a reactive epoxy coating onto the substrate, and then used to couple 4-diallylaminopyridine, to produce a grafted dialkylaminopyridine catalytic surface. Polymeric dialkylaminopyridines have been shown to be useful in catalyzing the destruction of chemical warfare agents and toxic industrial materials. (See e.g., Yokley and Nielsen, US Patent Application, US20110028774, Hypernucleophilic Catalysts for Detoxification of Chemical Threat Agents, incorporated by reference herein in its entirety).

Example 6

Electrically conducting coatings were applied to polypropylene and polyethylene tubes, polycarbonate and acrylic sheets, aluminum sheets, borosilicate glass slides and on inter-digitated conductive test structures; the substrates were treated in a two phase plasma coating process. The activation phase was conducted at 75 W power at 300 mTorr pressure using a 67% argon and 33% air plasma for 2 minutes. The subsequent phase admitted pyrrole into the plasma chamber at a pressure ranging from 300-400 mTorr for 75 W for 30 minutes. The chamber temperature rose from 12° C. to 18° C.

A thin colorless conformal coating of about 12 nm in thickness was deposited as characterized with an optical interferometry. The coatings were uniform, smooth and adherent. The electrical conductivity of the prepared conducting polymer films (comprised of mostly polypyrrole) was measured at room temperature by four-point probe technique, taking the average value of several readings at various points of the films. The electrical data varied significantly from site to site over the samples, and from sample to sample. The best conductivity of the as-deposited undoped films measured was about $1 \times 10^{-2}$ S/cm.

Example 7

Inert hydrogenated amorphous carbon film coatings (possibly containing sp3 and sp2 hybridized carbon, as well as C—H bonds) were applied to polypropylene and polyethylene tubes, polycarbonate and acrylic sheets, aluminum sheets, and glass slides; the substrates were treated in a two phase plasma coating process. The activation phase was conducted for 2 minutes at 175-300 mTorr and 75 W power, with argon as the background gas. In one embodiment, Carbon Tetrachloride ($CCl_4$) was introduced into the plasma chamber with argon as the carrier and background gas in the subsequent phase, at 75 W power and 175-300 mTorr for 30 minutes. In another embodiment, xylene ($C_7H_8$) was introduced into the plasma chamber with argon as the carrier and background gas in the subsequent phase, also at 75 W power and 175-300 mTorr for 30 minutes.

In both embodiments, the process produced a colorless conformal and hydrophobic coating. The thickness of the coating increased monotonically with increasing stage-two treatment time, reaching a thickness of about 150 nm in 30 minutes on all of the test surfaces. This suggests that the film deposition rate was independent of the carbon source, but depended only on the reactive precursor species reaching the activated surface, where it is readily incorporated into the growing film.

Example 8

Specialty filtration membranes and related devices are becoming an integral part of bioprocessing, semiconductor and other high value industrial processes. Likewise, microreactor technology where the configurations take advantage of high reactor surface to volume ratios to achieve specific surface binding of catalysts or other reaction modifiers are becoming items of intense study. In most cases the filter media are made from chemically inert and low surface energy materials such as polyethylene, polypropylene, other polyolefins or polysulfone. The coatings of this invention have the ability to directly and selectively modify the chemical properties of channels, micro-pinholes and tortuous paths of specific filters. The coatings of this invention are uniquely able to perform these operations since the activation is driven by the plasma which accesses all surfaces within the plasma reaction chamber, and the volatile monomers are delivered to the activated surface sites in the gas phase. The advantages of a rapid, general, and chemically flexible system that can be used on finished configurations on a dry-in/dry-out basis are clearly evident to those skilled in the art.

In this example, an embodiment of the process 100 of the disclosure was used to modify a variety of filter membranes materials, to create surfaces capable of binding metal ions through dative bonding. For example, by functionalizing the membrane with soft ligands (e.g., aliphatic-, thiols, amines, etc.) one can selectively bind coinage metal ions (Ag, Au, etc. . . . ). Specifically, the allyamine surfaces created in example 1, bind copper ions, and were used to reduce the concentration of $Cu^{2+}$ in aqueous solutions placed in contact with such surfaces.

Example 9

The performance of polyvinylalcohol (PVA) objects (e.g. PVA brushes) in aqueous environments are constrained by, but not limited to, the difficulties in hydration (requiring brushes to shipped in wet envelopes), bio-fouling (bacteria growth in the brushes leading to high particle count) and lack of application specificity ('one-size fits all' approach, use the same brush for all substrate)

Current efforts to address these concerns utilize modifications to the composition of the aqueous environments (e.g., cleaning solutions, etc.). Such modifications are not always successful. We propose to mitigate these limitations, without negatively impacting performance, with appropriate choice of secondary coatings on the brush bristles.

Specifically, using the inventions in this disclosure the inventors successfully modified commercial PVA brushes with secondary coatings that bind detrimental metallic species, such as Cu— and other metallic ions, to proactively address yield and reliability limiting dielectric contamination in semiconductor manufacturing. By appropriate choice of such coatings, it is possible to also prevent bio-fouling (bacteria growth in the brushes leading to high particle count) and lack of application specificity.

Example 10

The effects of sand erosion and/or ablation on helicopter rotors blades is a perennial problem in sandy environments and rotor blade replacement represents a significant cost over a helicopter's operational life. Most helicopter rotor blades include erosion protection in the form of leading edge strips made from metals such as nickel, titanium and stainless steel. Polyurethane-based coatings, tapes and boots have also been used for erosion protection. However, neither strategy gives optimal erosion resistance from both rain and sand. Metal leading edges have excellent rain resistance but poor sand erosion performance. Conversely, polyurethane-based coatings have good sand erosion protection, but poor rain resistance.

Increased durability of ceramic modified thermoplastics in corrosive aqueous abrasive environments have been demonstrated. In particular, two stage plasma based coatings of this invention of $SiO_x$ and $TiO_x$ to both thermoplastic and thermoset materials are used to improve durability. The coatings of this invention, in particular the inorganic oxides as applied to the previously described polyurethane rotor protection boots can provide effective aqueous surface protection in a high abrasive environment.

Those skilled in the art to which the invention relates will appreciate that other and further additions, deletions, substitutions and modifications may be made to the described embodiments without departing from the scope of the invention.

What is claimed is:

1. A film deposition process, comprising:
exposing a surface of a substrate to a first plasma treatment having plasma reactants in a plasma chamber to form an activated substrate surface, wherein the activated surface has a lower water contact angle than the substrate surface before the surface activation;
removing the plasma reactants from the plasma chamber; and then
introducing water vapor into the plasma chamber to form a water layer bonded to the activated surface; and then
introducing pre-cursors molecules into the plasma chamber in the presence of a second plasma treatment to graft a layer of reacted pre-cursor molecules to molecules of the water layer such that the molecules of the water layer form a bonding link between the substrate surface and the reacted pre-cursor molecules, wherein the second plasma treatment includes a plasma chamber pressure that is in a range from 100 mTorr to 500 mTorr.

2. The process of claim 1, wherein the substrate is a circuit board and the surface is a component-side surface of the circuit board.

3. The process of claim 1, wherein the molecules of the water layer forming the bonding link form a retained water layer having a thickness in a range from about 0.1 to 3 nanometers.

4. The process of claim 1, wherein the molecules of the water layer forming the covalent bonding link form a retained water layer having a thickness in a range from about 0.3 to 1.8 nanometers.

5. The process of claim 1, where removing the plasma reactants from the plasma chamber includes evacuating the plasma chamber of the first plasma reactants after forming the activated substrate surface.

6. The process of claim 5, wherein evacuating the plasma chamber includes reducing the atmospheric pressure in the plasma chamber to less than about 100 Torr for at least about 5 minutes.

7. The process of claim 1, wherein the water vapor is removed from the chamber before the second plasma treatment is commenced.

8. The process of claim 1, wherein the water vapor is introduced into the chamber for at least about 5 minutes before the second plasma treatment is commenced.

9. The process of claim 1, wherein the water vapor is introduced into the chamber for at least about 5 minutes and not longer than about 10 minutes before the second plasma treatment is commenced.

10. The process of claim 1, wherein introducing the water vapor into the plasma chamber includes introducing air into the chamber, wherein the air has a humidity of least about 45 percent at about 20° C., for at least about 5 minutes before introducing the pre-cursors molecules into the plasma chamber.

11. The process of claim 1, wherein introducing the water vapor into the plasma chamber includes introducing air into the chamber, wherein the air has a humidity of least about 45 percent at about 20° C., for at least about 5 minutes and not longer than about 10 minutes, before introducing the pre-cursors molecules into the plasma chamber.

12. The process of claim 1, further including repeating at least one time, each of said sequence of steps of exposing the surface, removing the plasma reactants from the plasma chamber, introducing the water vapor and introducing the pre-cursors molecules.

13. The process of claim 1, wherein the first plasma reactants are formed from one or more of Helium, Argon, Nitrogen, Neon, Silane, Hydrogen and Oxygen in the presence of the first plasma treatment that includes: a radiofrequency power in the range of about 30 to 500 Watts, a temperature in range of about 0° C. to about 100° C. for a time period in a range of about 0.5 to 10 minutes.

14. The process of claim 1, wherein the first plasma reactants are formed from Argon at pressures between about 50 and 500 mTorr in the presence of the first plasma treatment that includes a radiofrequency power in the range of about 50 to 200 Watts, a temperature in range of about 0° C. to about 100° C. for a time period in a range of about 0.5 to about 10 minutes.

15. The process of claim 1, wherein the precursor molecules include hexafluoropropylene introduced into the plasma chamber under an Argon plasma and the second plasma treatment includes: a radiofrequency power in the range of about 50 to 250 Watts, a temperature in range of about 10° C. to about 80° C. for a time period in a range of about 15 to about 60 minutes.

16. A film deposition process, comprising:
exposing a surface of a substrate to a first plasma treatment having plasma reactants in a plasma chamber to form an activated substrate surface, wherein the activated surface has a lower water contact angle than the substrate surface before the surface activation;
evacuating the plasma chamber of the first plasma reactants by reducing the atmospheric pressure in the plasma chamber to less than about 100 Torr for at least about 5 minutes after forming the activated substrate surface; and then
introducing air into the plasma chamber, wherein the air has a humidity of least about 45 percent for about 5 minutes to about 10 minutes; and then
introducing pre-cursors molecules into the plasma chamber in the presence of a second plasma treatment to graft a layer of reacted pre-cursor molecules to a substrate, wherein water molecules from the air introduced into the chamber form a bonding link between the substrate surface and the reacted pre-cursor molecules and the second plasma treatment includes a plasma chamber pressure that is in a range from 100 mTorr to 500 mTorr.

* * * * *